United States Patent
Lee

(10) Patent No.: US 7,154,418 B2
(45) Date of Patent: Dec. 26, 2006

(54) APPARATUS AND METHOD FOR ENCODING DIGITAL DATA

(75) Inventor: Shih-Ying Lee, Guangdong (CN)

(73) Assignee: Hon Hai Precision Industry Co., Ltd., Tu-Cheng (TW)

( * ) Notice: Subject to any disclaimer, the term of this patent is extended or adjusted under 35 U.S.C. 154(b) by 0 days.

(21) Appl. No.: 11/164,781

(22) Filed: Dec. 6, 2005

(65) Prior Publication Data
US 2006/0197687 A1    Sep. 7, 2006

(30) Foreign Application Priority Data
Dec. 21, 2004    (TW) ............................... 93139749 A

(51) Int. Cl.
*H03M 9/00*    (2006.01)
(52) U.S. Cl. .............................. 341/60; 341/50; 341/51
(58) Field of Classification Search .................. 341/50, 341/51, 52, 60, 100; 370/476, 505, 240, 370/242
See application file for complete search history.

(56) References Cited

U.S. PATENT DOCUMENTS

| | | | |
|---|---|---|---|
| 5,926,205 A * | 7/1999 | Krause et al. .............. 725/103 |
| 6,011,497 A * | 1/2000 | Tsang et al. ................... 341/59 |
| 6,054,492 A * | 4/2000 | Kabanov et al. ............. 514/772 |
| 6,072,838 A * | 6/2000 | Koos et al. .................. 375/242 |
| 6,704,853 B1 | 3/2004 | Imamura et al. |
| 6,920,124 B1 | 7/2005 | Lappe et al. |
| 2004/0135711 A1* | 7/2004 | Guosheng .................... 341/100 |
| 2004/0160345 A1* | 8/2004 | Liu et al. ....................... 341/59 |
| 2005/0258982 A1* | 11/2005 | Pearson et al. ............... 341/50 |
| 2006/0061494 A1* | 3/2006 | Hosaka et al. ................ 341/50 |
| 2006/0109152 A1* | 5/2006 | Lee ............................ 341/120 |

* cited by examiner

*Primary Examiner*—Linh Nguyen
(74) *Attorney, Agent, or Firm*—Winston Hsu

(57) ABSTRACT

A method for encoding digital data includes the step of: encoding the digital data to a corresponding digital signal sequence by a digital signal encoder (110) according to an encoding rule, which can be transmitted through the single digital circuit (12). The digital signal sequence includes a first digital signal, two second digital signals, and one or more compounding digital signals, each of which includes a third digital signal and the first digital signal. Each digital signal sequence begins with one second digital signal, which is followed by one first digital signal and one or more compounding digital signals, and ends with one second digital signal. A related apparatus is also disclosed.

10 Claims, 3 Drawing Sheets

APPARATUS AND METHOD FOR ENCODING DIGITAL DATA

FIELD OF THE INVENTION

The present invention relates to apparatuses and methods for processing digital data in electronic devices, and more particularly to an apparatus and method for encoding digital data in electronic devices.

DESCRIPTION OF RELATED ART

In recent years, electronic devices have been widely used in the home and workplace for quite some time. In order to meet users' requirements of the electronic devices, more and more electronic elements and integrated circuits have to be added in the electronic devices by designers. Generally, there are multiple signal circuits for synchronously transmitting digital signals to the corresponding electronic elements in the integrated circuits. Thus, the cubage of the integrated circuits in the electronic devices grows more and more large. As the performance capability of integrated circuit technology has increased over the years, the designers typically try to decrease the cubage of the integrated circuits by means of replacing multiple signal circuits with a single signal circuit. However, different digital signals are to be transmitted via the single signal circuit can be problematic if the digital signals interfere with each other.

What is needed, therefore, is an apparatus for encoding digital data to a corresponding digital signal sequence which can be transmitted via the single signal circuit without interference with other signals.

Similarly, what is also needed is a method for encoding digital data to a corresponding digital signal sequence which can be transmitted via the single signal circuit without interference with other signals.

SUMMARY OF THE INVENTION

An apparatus for encoding digital data which can be transmitted through a single digital signal circuit in accordance with a preferred embodiment includes a digital signal output device, a single digital signal circuit and digital signal receiving device. The digital signal output device includes a digital data encoder, which is used for encoding digital data to a corresponding digital signal sequence according to an encoding rule. The single digital signal circuit is used for transmitting the digital signal sequence from the digital signal output device. The digital signal receiving device is used for receiving the digital signal sequence from the single digital signal circuit.

Another preferred embodiment provides a method for encoding digital data which can be transmitted via a single digital signal circuit by utilizing the above apparatus. The method for encoding digital data includes the step of: encoding the digital data to a corresponding digital signal sequence by a digital signal encoder according to an encoding rule, which can be transmitted via the single digital signal circuit. The digital signal sequence comprises a first digital signal, two second digital signals, and one or more compounding digital signals, each of which includes a third digital signal and the first digital signal. Each digital signal sequence begins with a second digital signal, which is followed by a first digital signal and one or more compounding digital signals, and ends with a second digital signal. Wherein the first digital signal represents a digital signal with the value "0" lasting for a first interval, the second digital signal represents a digital signal with the value "1" lasting for a second interval, and the third digital signal represents a digital signal with the value "1" lasting for a third interval.

In summary, the apparatus and method can encode digital data to a corresponding digital signal sequence, which can effectively be transmitted on a single digital signal circuit without interference with other signals transmitted via the single digital signal circuit.

Other advantages and novel features of the embodiments will be drawn from the following detailed description with reference to the attached drawings, in which:

DETAILED DESCRIPTION

Figure 1:
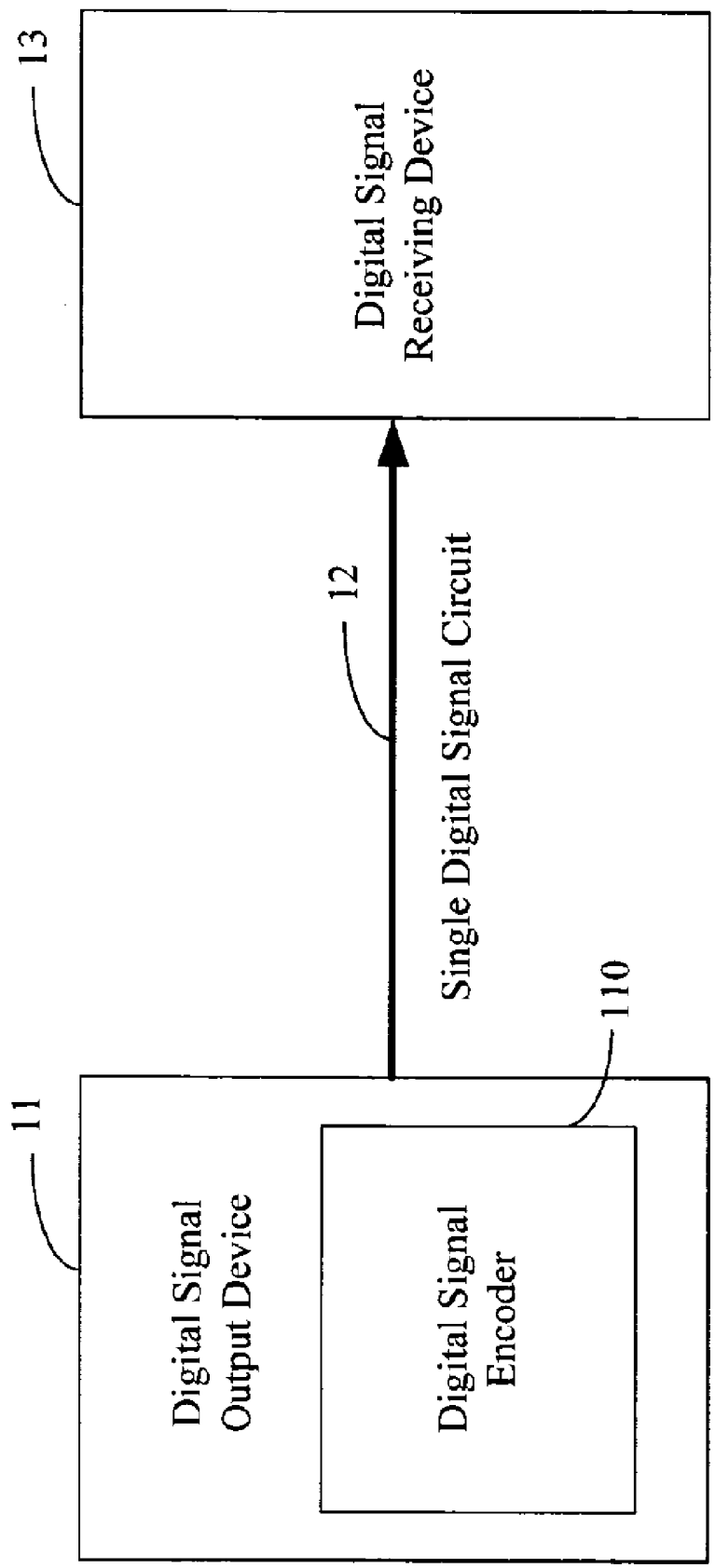
FIG. 1 is a schematic diagram of an apparatus for encoding digital data according to a preferred embodiment of the present invention.

FIG. 1 is a schematic diagram of an apparatus for encoding digital data (hereinafter "the apparatus") according to a preferred embodiment of the present invention. The apparatus includes a digital signal output device 11, a single digital signal circuit 12, and a digital signal receiving device 13. The digital signal output device 11 includes a digital data encoder 110, for encoding the digital data to a corresponding digital signal sequence according to an encoding rule, which can be transmitted via the single digital circuit 12. The encoding rule will be described in detail below by an example. The single digital signal circuit 12 is used for transmitting the digital signal sequence from the digital signal output device 11 to the digital signal receiving device 13.

Figure 2:
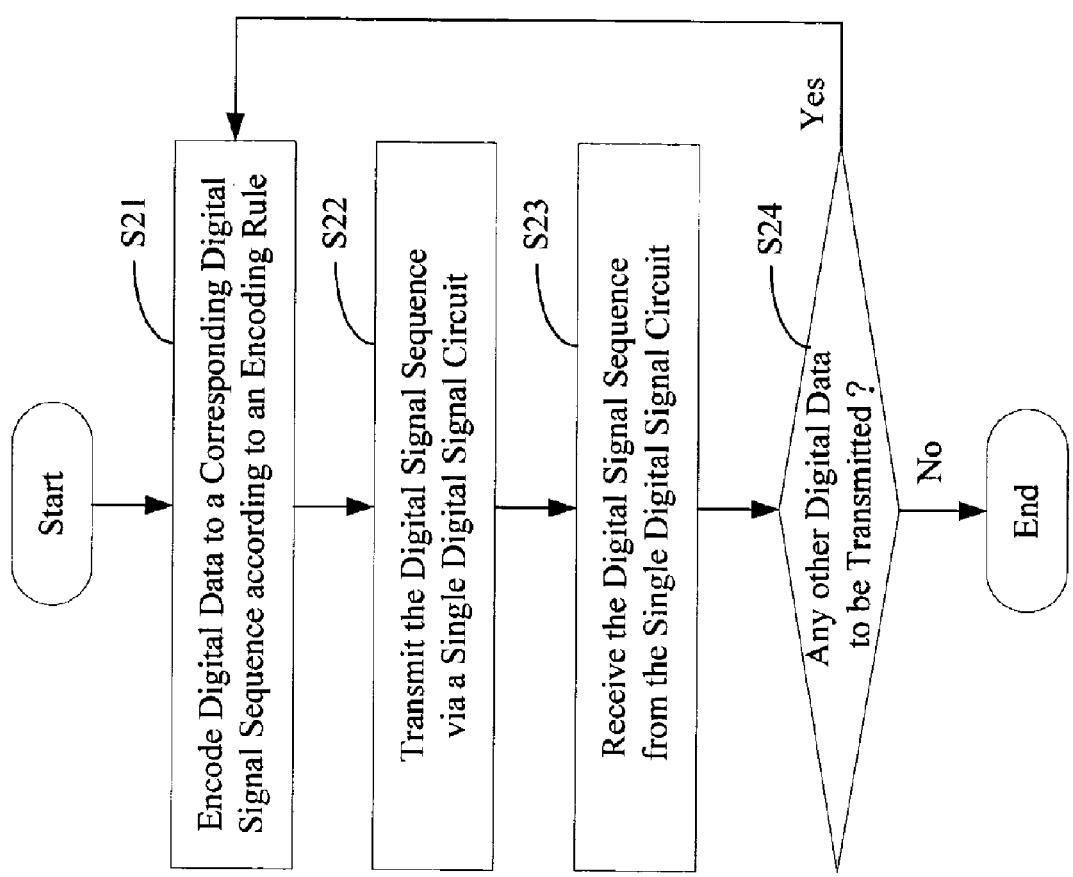
FIG. 2 is a flowchart of a preferred method for encoding digital data by implementing the apparatus of FIG. 1.

FIG. 2 is a flowchart of a preferred method for encoding digital data by implementing the apparatus of FIG. 1. In step S21, the digital data encoder 110 encodes the digital data to a corresponding digital signal sequence according to the encoding rule, which can be transmitted on the single digital signal circuit 12. In step S22, the digital signal output device 11 outputs the digital signal sequence through the single digital signal circuit 12. In step S23, the digital signal receiving device 13 receives the digital signal sequence from the single digital signal circuit 12. Then in step S24, the digital signal output device 11 determines whether any other digital data are to be transmitted through the single digital signal circuit 12. If there are other digital data to be transmitted via the single digital signal circuit 12, the procedure returns to step S21 described above. Otherwise, if no digital data are to be transmitted via the single digital signal circuit 12, the procedure is ended.

The following describes the encoding rule in detail by an example. It is assumed that each digital data to be transmitted through the single digital signal circuit 12 is denoted by a number. For example, the first digital data is denoted by "D1"; the second digital data is denoted by "D0"; the third digital data is denoted by "D2"; the fourth digital data is denoted by "D3"; . . . ; and the last digital data is denoted by "Dn." The digital data encoder 110 encodes each digital data to a corresponding digital signal sequence by means of utilizing the encoding rule as follows: D0: Sn, Sg, Sn; D1: Sn, Sg, (Sd, Sg), Sn; D2: Sn, Sg, (Sd, Sg), (Sd, Sg), Sn; D3: Sn, Sg, (Sd, Sg), (Sd, Sg), (Sd, Sg), Sn; . . . ; Dn: Sn, Sg, (Sd, Sg), (Sd, Sg), . . . , (Sd, Sg), Sn. Wherein "Sg" represents a digital signal with the value "0" lasting for a first interval "Tg"; "Sn" represents a digital signal with the value "1" lasting for a second interval "Tn"; and "Sd" represents a digital signal with the value "1" lasting for a third interval "Td." "Tg" meets a first formula: Tgmax>=Tg>=Tgmin, wherein "Tgmax" represents a maximum value of the first interval, and "Tgmin" represents a minimum value of the first interval. "Tn" meets a second formula: Tn>Tdmax. "Td" meets a third formula: Tdmax>=Td>=Tdmin, wherein "Tdmax" represents a maximum value of the third interval, and "Tdmin" represents a minimum value of the third interval.

According to the above-described encoding rule, each digital signal sequence includes a first digital signal depicted as "Sg," two second digital signals depicted as "Sn," and n compounding digital signals including a third digital signal "Sd" and a first digital signal "Sg," each of which can be depicted as "(Sd, Sg)." Each digital signal sequence begins with a second digital signal "Sn," which is followed by a first digital signal "Sg" and n compounding digital signals "(Sd, Sg)," and ends with a second digital signal "Sn."

Figure 3:
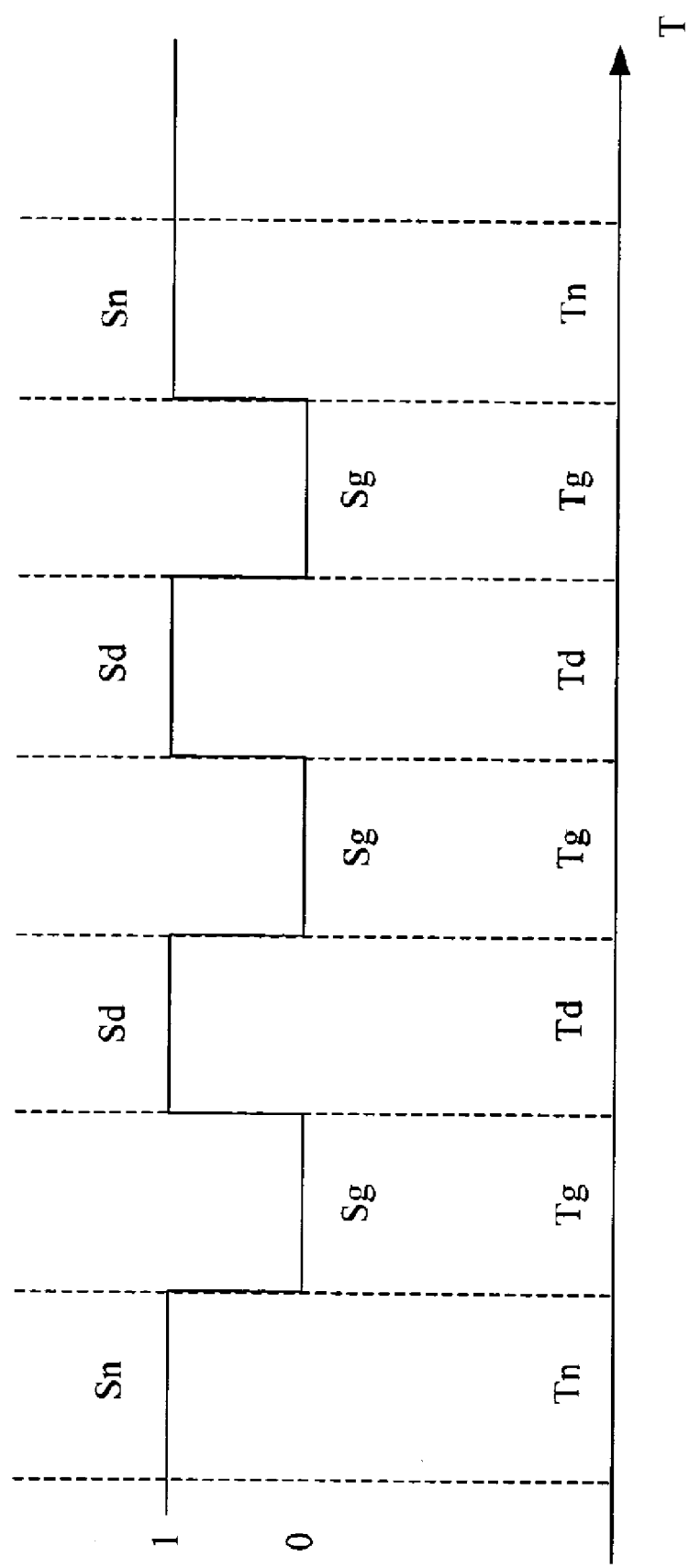
FIG. 3 is a schematic diagram of a digital signal sequence which can be transmitted through a single digital signal circuit according to the preferred embodiment of the present invention.

FIG. 3 is a schematic diagram of a digital signal sequence which can be transmitted through the single digital signal circuit 12 according to the preferred embodiment of the present invention. It is assumed that the third digital data D2 needs to be transmitted through the single digital signal circuit 12. According to the encoding rule described above, a section time "T" is divided into a plurality of intervals which are respectively depicted as "Tn," "Tg," "Td," "Tg," "Td," "Tg, " and "Tn." The digital data encoder 110 encodes each digital signal "1" or each digital signal "0" of the third digital data D2 to a corresponding digital signal sequence, which can be denoted by "Sn, Sg, (Sd, Sg), (Sd, Sg), Sn." Therefore, the digital signal sequence can be transmitted through the single digital signal circuit 12.

Although the present invention has been specifically described on the basis of a preferred embodiment and preferred method, the invention is not to be construed as being limited thereto. Various changes or modifications may be made to the embodiment and method without departing from the scope and spirit of the invention.

What is claimed is:

1. An apparatus for encoding digital data, comprising:
    a digital signal output device comprising a digital data encoder for encoding each digital data to a corresponding digital signal sequence according to an encoding rule; and
    a single digital signal circuit for transmitting the digital signal sequence from the digital signal output device wherein each digital signal sequence comprises a first digital signal, two second digital signals, and one or more compounding digital signals, each of which includes a third digital signal and the first digital signal.

2. The apparatus according to claim 1, further comprising a digital signal receiving device for receiving the digital signal sequence from the single digital signal circuit.

3. A method for encoding digital data, the method comprising the step of:
    encoding the digital data to a corresponding digital signal sequence by a digital signal encoder according to an encoding rule, which can be transmitted through a single digital signal circuit, the digital signal sequence comprising a first digital signal, two second digital signals, and one or more compounding digital signals, each of which includes a third digital signal and the first digital signal.

4. The method according to claim 3, wherein the digital signal sequence begins with a second digital signal, which is followed by a first digital signal and one or more compounding digital signals, and ends with a second digital signal.

5. The method according to claim 3, wherein the first digital signal represents a digital signal with the value "0" lasting for a first interval Tg.

6. The method according to claim 5, wherein the first interval Tg meets a first formula: Tgmax>=Tg>=Tgmin, wherein Tgmax represents a maximum value of the first interval, and Tgmin represents a minimum value of the first interval.

7. The method according to claim 3, wherein the second digital signal represents a digital signal with the value "1" lasting for a second interval Tn.

8. The method according to claim 7, wherein the second interval Tn meets a second formula: Tn>Tdmax, wherein Tdmax represents a maximum value of the second interval.

9. The method according to claim 3, wherein the third digital signal represents a digital signal with the value "1" lasting for a third interval Td.

10. The method according to claim 9, wherein the third interval Td meets a third formula: Tdmax>=Td>=Tdmin, wherein Tdmax represents a maximum value of the third interval, and Tdmin represents a minimum value of the third interval.

* * * * *